United States Patent [19]

Seshan et al.

[11] Patent Number: 5,841,379
[45] Date of Patent: Nov. 24, 1998

[54] METHOD AND APPARATUS FOR SELECTIVELY COUNTING CONSECUTIVE BITS

[75] Inventors: Natarajan Seshan, Houston; Laurence R. Simar, Jr., Richmond, both of Tex.

[73] Assignee: Texas Instruments Incorporated, Dallas, Tex.

[21] Appl. No.: 788,751

[22] Filed: Jan. 24, 1997

[51] Int. Cl.[6] ............................................. H03M 7/46
[52] U.S. Cl. .......................... 341/63; 341/50; 341/59; 341/74; 341/87
[58] Field of Search ................................ 341/63, 59, 74, 341/87, 50

[56] References Cited

U.S. PATENT DOCUMENTS

| | | | |
|---|---|---|---|
| 4,207,599 | 6/1980 | Murayama et al. | 358/261 |
| 5,113,266 | 5/1992 | Sugiura | 358/426 |
| 5,305,111 | 4/1994 | Chao et al. | 358/261.1 |
| 5,357,546 | 10/1994 | Meriwether et al. | 375/122 |
| 5,689,255 | 11/1997 | Frazier et al. | 341/63 |
| 5,710,561 | 1/1998 | Schmidt et al. | 341/63 |

*Primary Examiner*—Howard L. Williams
*Attorney, Agent, or Firm*—J. Dennis Moore; James C. Kesterson; Richard L. Donaldson

[57] ABSTRACT

A method for compression of digital data in a computer having a processor and a memory, wherein a group of consecutive bits having the same binary value is represented by a result number corresponding to the number of the consecutive bits. The method involves the following steps. A block of digital data to be compressed is provided. A bit detect selection parameter determines a bit value to be counted for counting consecutive bits. The processor is instructed to count from a first end of the block of digital data toward a second end of the block of digital data the number of consecutive bits having the bit value determined by the bit detect selection parameter. The number of bits so counted is stored, and the bit detect selection parameter is toggled. The processor is then instructed to count from the last bit counted toward the second end of the block of digital data the number of bits having the bit value determined by the current bit detect selection parameter. The foregoing steps are repeated, with successive numbers being stored representing the number of bits counted in successive counts as successive stored result numbers, until all bits in the block of digital data are counted.

1 Claim, 3 Drawing Sheets

METHOD AND APPARATUS FOR SELECTIVELY COUNTING CONSECUTIVE BITS

RELATED APPLICATIONS

This application is related to co-pending application Ser. No. 08/815,262, entitled Method and Apparatus for Processing an Interrupt, Attorney's Docket TI-22110, both applications having the same assignee.

TECHNICAL FIELD OF THE INVENTION

This invention relates generally to the field of digital signal processors and more particularly to a method and apparatus for selectively counting consecutive bits.

BACKGROUND OF THE INVENTION

Digital signal processors are well known devices for performing high-speed data manipulations. Digital signal processors are often used in data transmission and reception applications, such as a facsimile machine. In such applications, it is often necessary to store representations of an image, such as a facsimile page, as binary numbers. One method of storing such data is dividing the image into numerous pixels and designating each pixel as either on or off. The status of each pixel is stored as either a one or a zero bit in a binary number.

Such a method of storing an image can consume large amounts of memory because of the large number of pixels in each image. Therefore, it is often desirable to store a representation of the image in a more compact form. Because each horizontal line of pixels often comprises long strings of adjacent pixels that are either all on or all off, a representation of the image can be stored in a more compact form by storing the number of consecutive zeros followed by the number of consecutive ones and so on. One method for facilitating this method of storage comprises starting at the left-most bit of a binary number and searching toward the least-significant bit for the left-most or most-significant one. While searching, the number of zeros encountered before reaching the left-most one are counted and stored. After the left-most one is encountered, the search proceeds for the left-most zero. While searching for the left-most zero, ones are counted. In this manner, a binary number can be stored by a shorter number containing the number of consecutive ones and zeros.

One conventional method for implementing this conversion utilizes a digital signal processor having separate left-most one routines and left-most zero routines. Thus in order to convert data, two routines must be called in sequence. This procedure can be time consuming, which is detrimental to the performance of digital signal processors, particularly those operating in real-time applications. In addition, such a procedure increases the code size required by the digital signal processor.

SUMMARY OF THE INVENTION

Therefore, a need has arisen for a new method that overcomes the disadvantages and deficiencies of the prior art. The invention comprises a method for selectively counting bits.

According to the invention, in a computer having a processor capable of executing instructions, and having a memory, a method is provided for automated compression of a digital data, wherein a group of consecutive bits having the same binary value is represented by a result number corresponding to the number of the consecutive bits. The method involves the following steps. A block of digital data to be compressed is provided. A bit detect selection parameter is provided that determines a bit value to be counted for counting consecutive bits, the bit detect selection parameter being capable of being toggled between a first setting and a second setting, the respective settings determining respective different bit values to be counted. The processor is instructed, in a first step of instructing, to count from a first end of the block of digital data toward a second end of the block of digital data the number of consecutive bits having the bit value determined by the bit detect selection parameter. If the first step of instructing results in all bits in the block of digital data being counted, a number is stored representing the number of bits so counted as a first stored result number and the completion of the method for the block of digital data is indicated. Otherwise, if the first step of instructing does not result in all bits in the block of digital data being counted, as a first repeatable step the number of bits so counted in the first step of instructing is stored, and the bit detect selection parameter is toggled to another, current value. The processor is then instructed, in a second, repeatable step of instructing, to count from the last bit counted in the first step of instructing toward the second end of the block of digital data the number of bits having the bit value determined by the current bit detect selection parameter. If the second step of instructing results in all bits in the block of digital data being counted, a number is stored representing the number of bits so counted in the second step of instructing as a second stored result number and the completion of the method for the block of digital data is indicated. Otherwise, if the second step of instructing does not result in all bits in the block of digital data being counted, the foregoing repeatable steps are repeated, with successive numbers being stored representing the number of bits counted in successive counts as successive stored result numbers, until the second step of instructing results in all bits in the block of digital data being counted. Then the completion of the method for the block of digital data is indicated.

The invention provides several technical advantages. For example, rather than requiring two separate pieces of code to count ones or zeros, a single piece of code can handle counting of either ones or zeros. Any performance penalty associated with branching between two pieces of code may therefore be avoided, allowing more timely processing of data. Timely processing is particularly important in processors operating in real time applications. In addition, the code size may be reduced due to the use of only one program rather than two. Smaller code size allows more resources to be devoted to other applications or decreased cost due to reduced memory requirements.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

An embodiment of the present invention and its advantages are best understood by referring to FIGS. 1 through 5 of the drawings, like numerals being used for like and corresponding parts of the various drawings. This application is related to co-pending application Ser. No. 08/815, 262, entitled Method and Apparatus for Processing an Interrupt, Attorney's Docket TI-22110, assigned to Texas Instruments of Dallas, Tex., which is hereby incorporated by reference.

Figure 1:
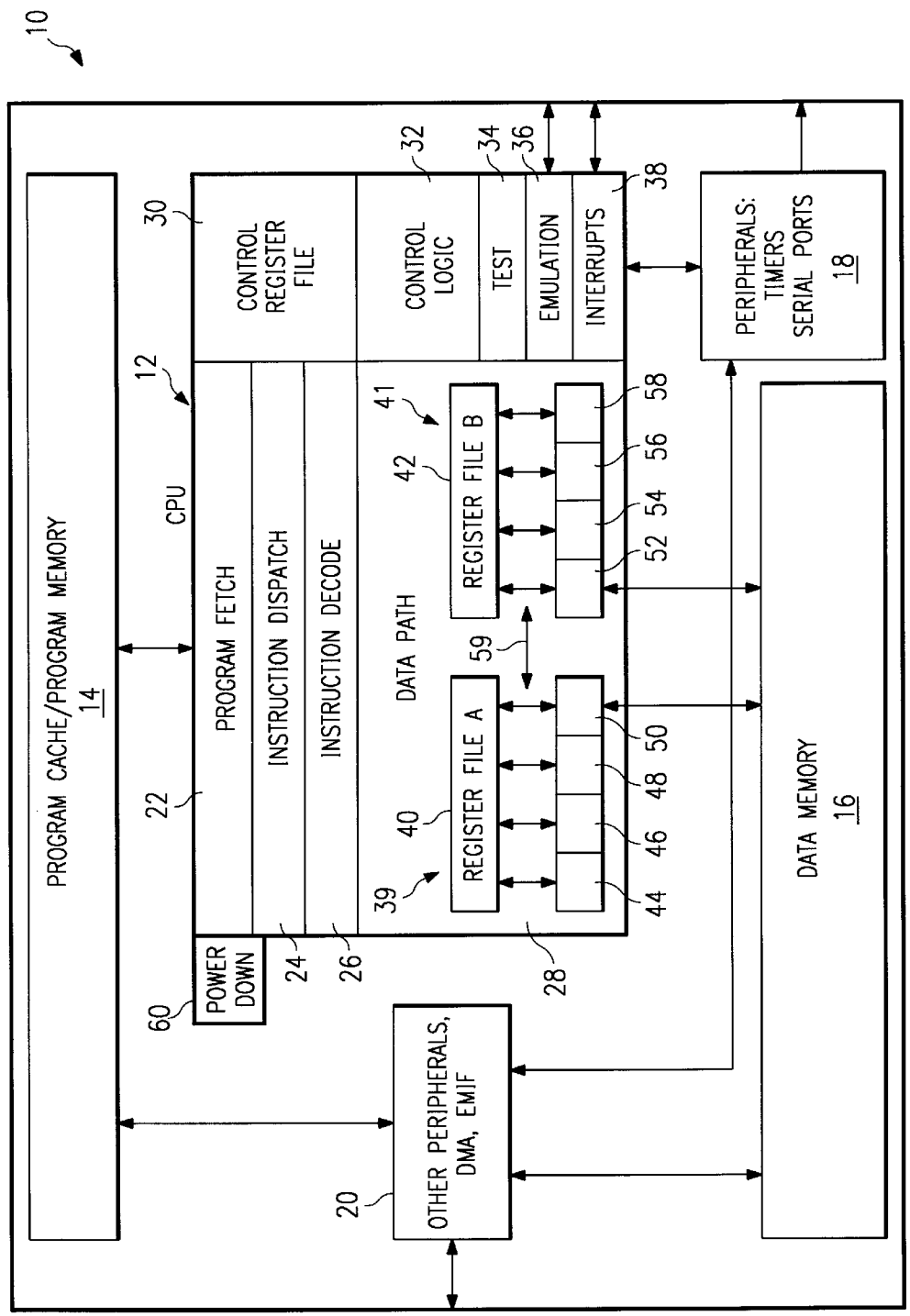
FIG. 1 is a block diagram of a digital signal processor according to one embodiment of the invention.

FIG. 1 is a block diagram of a digital signal processor 10 according to one embodiment of the invention. Digital signal processor 10 comprises code that is operable to selectively detect either the left-most zero or the left-most one in a portion of a binary number based on a bit detect selection parameter. Alternatively, in another embodiment of the invention, a digital signal processor formed according to the invention is operable to selectively detect either the right-most zero or the right-most one in a portion of a binary number based on the value of a bit detect selection parameter. Thus, digital signal processor 10 can selectively determine the number of consecutive ones or zeros in portions of a binary number and therefore store and transmit binary numbers is a more compact fashion. Digital signal processor 10 therefore allows for efficient storage of data.

Digital signal processor 10 may include a central processing unit 12, a program memory 14, a data memory 16, peripherals 18, and additional peripherals 20. Program memory 14 may be selectable for use as program memory or program cache. Peripherals 18 may comprise devices such as serial ports and/or timers. Additional peripherals 20 may include, for example, an external memory interface or a direct memory access controller. Program memory 14, data memory 16, peripherals 18, and additional peripherals 20 are coupled to and provide support to central processing unit 12 to enable digital signal processor 10 to perform its tasks. The determination of the number of consecutive ones or the number of consecutive zeros in a portion of a binary number by digital signal processor 10 is handled by the execution of code by the central processing unit 12 that may be stored in program memory 14.

Central processing unit 12 may include a program fetch unit 22, an instruction dispatch unit 24, an instruction decode unit 26, a data path unit 28, a control register file 30, a control logic unit 32, a test unit 34, an emulation unit 36, an interrupt unit 38, and a power down unit 60. Processing occurs in data path unit 28, which includes data paths 39 and 41. Data paths 39 may have four functional units 44, 46, 48, and 50. Data path 39 may further include a register file 40. Register file 40 may have sixteen 16 thirty-two-bit registers. Data path 41 may include four functional units 52, 54, 56, and 58. Data path 41 may further include a register file 42. Register file 42 may comprise sixteen thirty-two-bit registers. Register files 40 and 42 are connected by a cross path 59 so that the functional units in each may access operands from either register file 40 and 42. Control register file 30, control logic unit 32, test unit 34, emulation system 36, and interrupt system 38 perform additional functions related to various aspects of digital signal processor 10. Power down unit 60 controls operations associated with terminating power to central processing unit 12. Counting of consecutive ones or zeros occurs through execution of code stored in data memory 14 by data path unit 28. Program fetch unit 22, instruction dispatch unit 24, and instruction decode unit 26 deliver instructions from the program memory 14 to the functional units 44, 46, 48, 50, 52, 54, 56, and 58 of data path unit 28.

Figure 2:
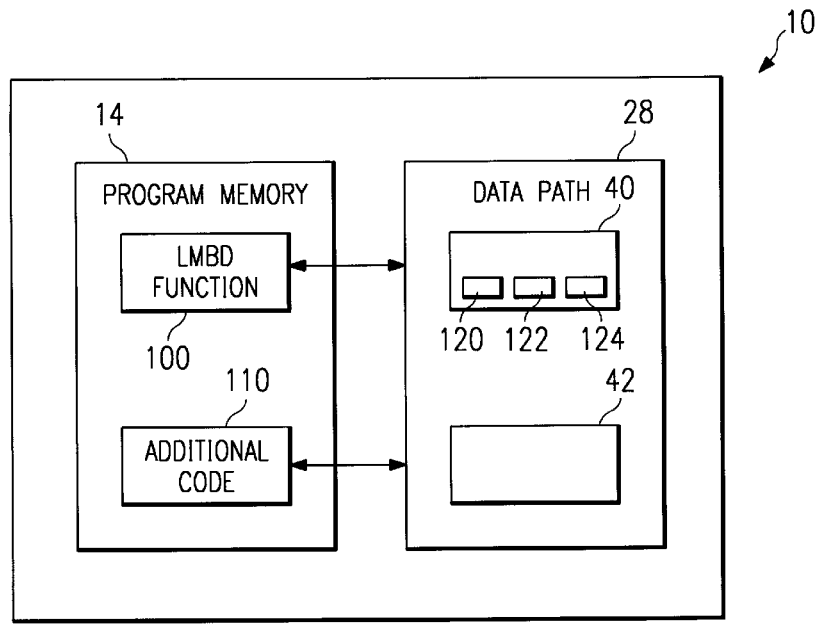
FIG. 2 is a schematic of the digital signal processor shown in FIG. 1, showing additional details of the program memory of the digital signal processor.

Referring now to FIG. 2, a schematic is illustrated of digital signal processor 10 shown in FIG. 1, showing additional details of program memory 14. In the embodiment illustrated in FIG. 2, program memory 14 may store a left-most bit detect (LMBD) program or function 100. Left-most bit detect function 100 may also be stored within other storage devices accessible by central processing unit 12. Left-most bit detect function 100 may be a portion of the instruction set of digital signal processor 10. According to one embodiment of the invention and as discussed in greater detail below in conjunction with FIG. 3, left-most bit detect function 100 is operable to be executed by data path 28 of digital signal processor 10 to determine the number of consecutive ones or the number of consecutive zeros in a portion of a binary number. As discussed in greater detail below, additional programming or code 110 may be used in conjunction with left-most bit detect function 100 to facilitate counting of all the consecutive ones or zeros in a binary number. Additional code 110 may be stored within program memory 14 or located in other storage devices accessible by the central processing unit 12.

In one embodiment, left-most bit detect function 100 is operable to receive three parameters: a bit detect selection parameter 120, a source number parameter 122, and a destination parameter 124. Bit detect selection parameter 120 is shown as stored in register file 40, but could be stored in any suitable location for use with left-most bit detect function 100. Bit detect selection parameter 120 indicates whether left-most bit detect function 100 should count zeros or count ones. In one embodiment, bit detect selection parameter 120 is stored as the least-significant bit of a thirty-two bit number stored in a register in register file 40. Bit detect selection parameter 120 may be specified by a user or other additional code, such as additional code 110 stored in program memory 14. According to one embodiment of the invention, if bit detect selection parameter 120 is one, the left-most bit detect function 100 will count consecutive zeros until reaching a one. If left-most bit detect parameter is zero, the left-most bit detect function 100 will count consecutive ones until reaching a zero. Source number parameter 122 is the binary number of which the left-most bit detect program will count either zeros or ones. Source number parameter 122 is shown as stored in register file 40, but could be stored in any suitable location for use with left-most bit detect function 100. Destination parameter 124 comprises the address used by left-most bit detect program to store the result 126 of the number of counted ones or zeros. Destination parameter 124 is shown as stored in register file 40, but could be stored in any suitable location for use with left-most bit detect function 100.

Figure 3A:
FIGS. 3A through 3C illustrate three examples of the operation of the left-most bit detect program shown in FIG. 2.
Figure 3B:
Figure 3C:
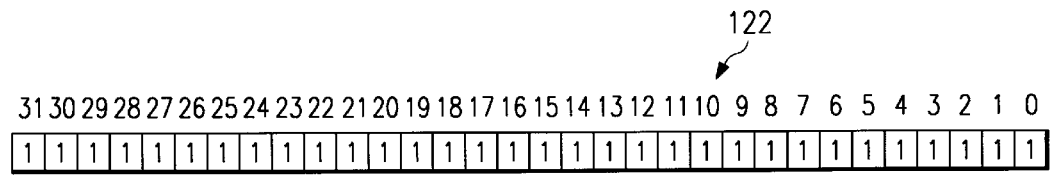

FIGS. 3A through 3C illustrates three examples of the operation of left-most bit detect function 100. The following table summarizes the three input parameters 120, 122, and 124 and the result 126 for FIGS. 3A through 3C.

| FIGURE No. | Left-Most Bit Detect Parameter (120) | Source Number Parameter (122) | Result (126) Stored in Address Specified by Destination Parameter (124) |
|---|---|---|---|
| 3A | 0 | 01XXXXXXXXXXXXXXXXXXXXXXXXXXXXXX | 0 |
| 3B | 1 | 00001XXXXXXXXXXXXXXXXXXXXXXXXXXX | 4 |
| 3C | 0 | 11111111111111111111111111111111 | 32 |

FIG. 3A illustrates the condition in which left-most bit detect function 100 is executed with bit detect selection parameter 120 equal to zero and the two most-significant bits of the source number parameter 122 equal to 01. Therefore, left-most bit detect function 100 counts consecutive ones, starting with the most-significant bit, until it reaches a zero. Because the first number left-most bit detect function 100 encounters is a zero, the result 126 is zero and is stored in the address specified by destination parameter 124. It should be understood that left-most bit detect function 100 could be replaced with a right-most bit detect function that counts consecutive ones or zeros, starting with the least-significant bit, until it reaches a zero or one, without departing from the teachings of the invention.

FIG. 3B illustrates the condition in which left-most bit detect function 100 is executed with bit detect selection parameter 120 equal to one and the five most-significant bits of the source number parameter 122 equal to 00001. Therefore, the left-most bit detect function 100 counts consecutive zeros, starting with the most-significant bit, until it reaches a one. Because the left-most bit detect function 100 encounters four zeros before reaching a one, the result 126 is four and is stored in the address specified by destination parameter 124.

FIG. 3C illustrates the condition in which left-most bit detect function 100 is executed with bit detect selection parameter 120 equal to zero and all bits in the source number parameter 122 equal to one. Therefore, the left-most bit detect function 100 counts consecutive ones, starting with the most-significant bit, until it reaches the end of number parameter 122. Because the left-most bit detect function 100 encounters thirty-two ones before reaching the end of number parameter 122, the result 126 is thirty-two and is stored in the address specified by destination parameter 124.

Figure 4:
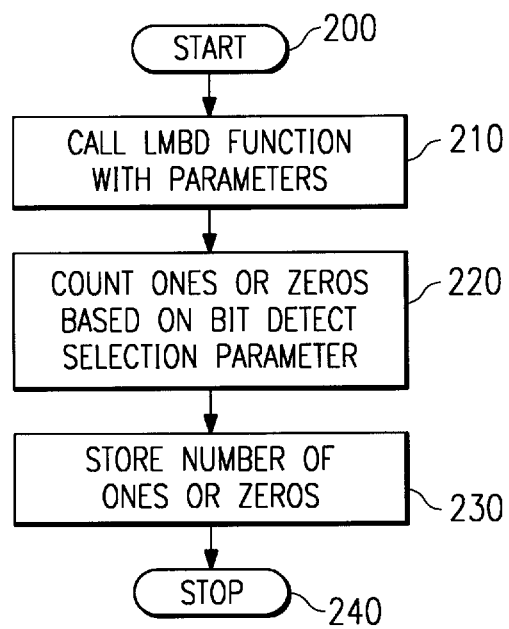
FIG. 4 is a flow chart illustrating the execution of the left-most bit detect program shown in FIG. 2.

FIG. 4 is a flow chart illustrating the execution of left-most bit detect function 100. With reference to FIGS. 1 through 4, the operation of the left-most bit detect function 100 will be described. At step 200 the execution begins. At step 210 left-most bit detect function 100 is called. Left-most bit detect function 100 is called with three parameters—the bit detect selection parameter 120, source number parameter, 122 and destination parameter 124. Executing left-most bit detect function 100 may be accomplished, for example, by executing an instruction "LMBD src1, src2, dst," where src1 is a thirty-two bit number stored in a register in register file 40 that contains left-most bit detect parameter, src2 is the source number parameter 122, and dst is the destination parameter 124. However, numerous alternative methods to initiate execution of left-most bit detect function 100 and passing of parameters 120, 122, and 124 may be utilized. At step 220, left-most bit detect function 100 counts, starting with the left-most bit source number parameter 122, the number of consecutive ones or zeros. If the specified left-most bit detect parameter is one, then zeros are counted until a one is encountered. If the specified left-most bit detect parameter is zero, then ones are counted until a zero is encountered. At step 230 the result 126, which is the number of consecutive ones or zeros counted, is stored in the address specified by destination parameter 124. At step 240 the execution of left-most bit detect function 100 ends.

Figure 5:
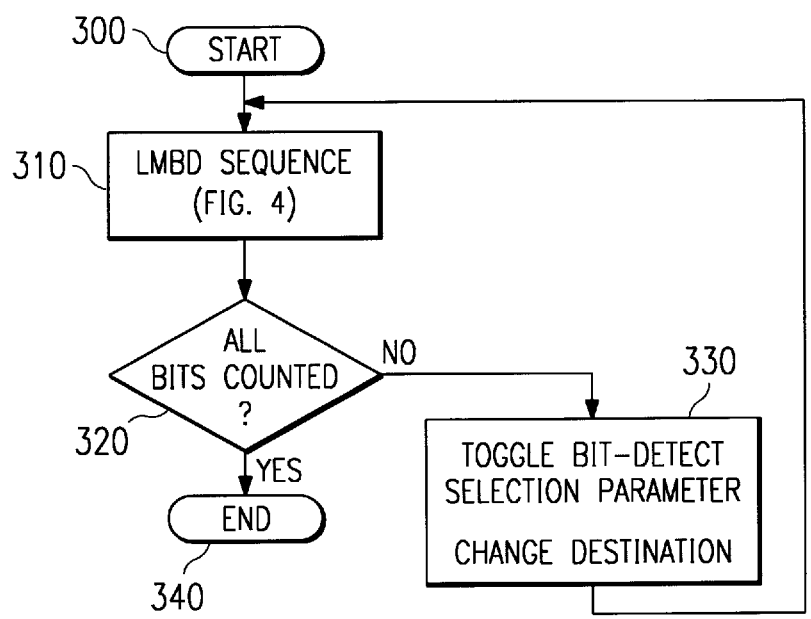
FIG. 5 is a flow chart illustrating the use of the left-most bit detect function shown in FIG. 2 in conjunction with the additional programming shown in FIG. 2.

FIG. 5 is a flow chart illustrating the use of left-most bit detect function 100 in conjunction with another additional program, such as additional code 110. An example of suitable additional code is provided below in Table 1. At step 300 the execution begins. At step 310, the steps associated with executing left-most bit detect function 100 are performed as discussed in conjunction with FIG. 4. At step 320, a determination is made whether all bits of source number parameter 122 have been counted. If all bits have been counted, execution is ended at step 340. If all bits were not counted, the execution continues at step 330. Steps 320 and 330 may comprise the execution of additional code, such as additional code 110. At step 330 the bit detect selection parameter 120 is toggled so that left-most bit detect function 100 will count ones if it was previously counting zeros and count zeros if it was previously counting ones. Additionally step 330 may comprise either changing the destination parameter 124 or rewriting the result 126 from the location specified by destination parameter 124 to a different address to avoid overwriting by the next result 126. After all of the bits of source number parameter 124 are counted, execution ends at step 340. In another embodiment, left-most bit detect program or function 100 may itself perform the functions discussed with respect to step 330 and therefore allow counting of all bits in source number parameter 122.

TABLE 1

EXAMPLE ADDITIONAL PROGRAMMING 110

```
void
run (unsigned int *input, unsigned short *code, int n)
{
    unsigned int   cnt;
    unsigned int   left = 32;
    unsigned int   run = 0;
    unsigned int   bit = 0;
    unsigned int   val = *input++;
    while (n) {
        cnt=__lmbd (bit, val);
        if (cnt < left) {
            val <<= cnt;
            left -= cnt;
            *code++ = run + cnt;
            bit++;
            run = 0;
        } else {
            run += left;
            val = *input++;
            left = 32;
            n--;
        }
    }
    *code = run;
}
```

Although the invention has been particularly shown and described by the foregoing detailed description, it will be understood by those skilled in the art that various other changes in form and detail may be made without departing from the spirit and scope of the invention. For example, although the invention has been described in the context of left-most bit detect function 100, the invention contemplates the use of a right-most bit detect function to count consecutive ones or zeros starting from the right, or least-significant bit, based on the value of bit detect selection parameter 120.

What is claimed is:

1. In a computer having a processor capable of executing instructions, and having a memory, a method for automated compression of a digital data, wherein a group of consecutive bits having the same binary value is represented by a result number corresponding to the number of said consecutive bits, comprising the steps of:

a) providing a block of digital data to be compressed;

b) providing a bit detect selection parameter that determines a bit value to be counted for counting consecutive bits, said bit detect selection parameter being capable of being toggled between a first setting and a second setting, said respective settings determining respective different bit values to be counted;

c) instructing the processor, in a first step of instructing, to count from a first end of said block of digital data toward a second end of said block of digital data the number of consecutive bits having said bit value determined by said bit detect selection parameter;

d) if said first step of instructing results in all bits in said block of digital data being counted, storing a number representing the number of bits so counted as a first stored result number and indicating the completion of the method for said block of digital data;

e) otherwise, if said first step of instructing does not result in all bits in said block of digital data being counted, storing the number of bits so counted in said first step of instructing, toggling said bit detect selection parameter to another, current value and instructing said processor, in a second step of instructing, to count from the last bit counted in said first step of instructing toward said second end of said block of digital data the number of bits having the bit value determined by said current bit detect selection parameter;

f) if said second step of instructing results in all bits in said block of digital data being counted, storing a number representing the number of bits so counted in said second step of instructing as a second stored result number and indicating the completion of the method for said block of digital data; and g) otherwise, if said second step of instructing does not result in all bits in said block of digital data being counted, repeating steps e) and f), storing successive numbers representing the number of bits counted in successive counts as successive stored result numbers, until said second step of instructing results in all bits in said block of digital data being counted, and then indicating the completion of the method for said block of digital data.

* * * * *